US010218315B2

United States Patent
Moronval

(10) Patent No.: US 10,218,315 B2
(45) Date of Patent: Feb. 26, 2019

(54) DOHERTY AMPLIFIER

(71) Applicant: Ampleon Netherlands B.V., Nijmegen (NL)

(72) Inventor: Xavier Bruno Jean Moronval, Tournefeuille (FR)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 15/546,908

(22) PCT Filed: Feb. 4, 2016

(86) PCT No.: PCT/EP2016/052423
§ 371 (c)(1),
(2) Date: Jul. 27, 2017

(87) PCT Pub. No.: WO2016/124707
PCT Pub. Date: Aug. 11, 2016

(65) Prior Publication Data
US 2018/0034419 A1 Feb. 1, 2018

(30) Foreign Application Priority Data
Feb. 4, 2015 (EP) .................................... 15153816

(51) Int. Cl.
*H03F 3/68* (2006.01)
*H03F 1/02* (2006.01)
(Continued)

(52) U.S. Cl.
CPC .............. *H03F 1/0288* (2013.01); *H03F 1/56* (2013.01); *H03F 1/565* (2013.01); *H03F 3/195* (2013.01);
(Continued)

(58) Field of Classification Search
CPC ................................. H03F 1/0288; H03F 3/68
(Continued)

(56) References Cited

U.S. PATENT DOCUMENTS

2014/0312976 A1\* 10/2014 Noori .................... H03F 1/0288
330/295
2015/0091651 A1\* 4/2015 Seneviratne .............. H03F 1/42
330/295

FOREIGN PATENT DOCUMENTS

| EP | 2 315 351 A1 | 4/2011 |
| EP | 2 403 135 A1 | 1/2012 |
| EP | 2 608 400 A1 | 6/2013 |

OTHER PUBLICATIONS

PCT International Search Report and Written Opinion, PCT International Application No. PCT/EP2016/052423, dated Oct. 12, 2016, 11 pages.

\* cited by examiner

*Primary Examiner* — Steven J Mottola
(74) *Attorney, Agent, or Firm* — McDonnell Boehnen Hulbert & Berghoff LLP

(57) ABSTRACT

Embodiments described herein relate to a Doherty amplifier. The Doherty amplifier may include a main amplifier and a first peak amplifier, a second peak amplifier, and a third peak amplifier, each amplifier having an input and an output. The Doherty amplifier may also include a combining network configured for combining signals emerging at outputs of the amplifiers. The signals are combined at a combining node. The combining network includes a first impedance inverter arranged in between the output of the main amplifier and the output of the third peak amplifier. The combining network also includes a second impedance inverter arranged in between the output of the first peak amplifier and the output of the second peak amplifier. The combining network also (Continued)

includes a first 180 degrees phase shifter and a second 180 degrees phase shifter. Additionally, the combining network includes a third impedance inverter.

18 Claims, 12 Drawing Sheets

(51) Int. Cl.
    *H03F 1/56*         (2006.01)
    *H03F 3/24*         (2006.01)
    *H03F 3/60*         (2006.01)
    *H03F 3/195*       (2006.01)
    *H03F 3/213*       (2006.01)
(52) U.S. Cl.
    CPC .............. *H03F 3/213* (2013.01); *H03F 3/245* (2013.01); *H03F 3/604* (2013.01); *H03F 2200/387* (2013.01); *H03F 2200/423* (2013.01); *H03F 2200/451* (2013.01)
(58) Field of Classification Search
    USPC ............................................ 330/124 R, 295
    See application file for complete search history.

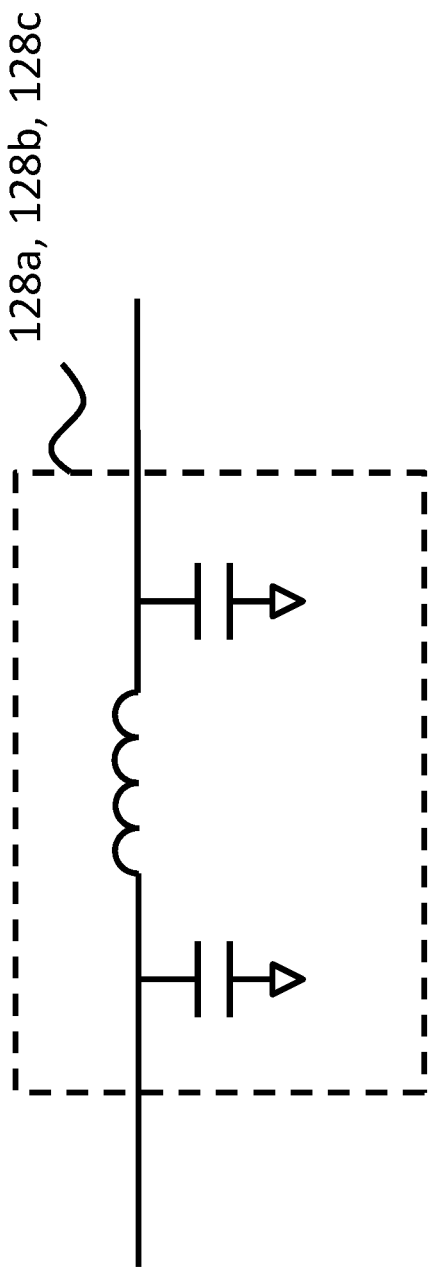

DOHERTY AMPLIFIER

CROSS-REFERENCE TO RELATED APPLICATION

The present application is a national stage entry of PCT/EP2016/052423 filed Feb. 4, 2016, which claims priority to EP 15153816.2 filed on Feb. 4, 2015, the contents of each of which are hereby incorporated by reference.

FIELD OF THE DISCLOSURE

The present disclosure relates to a Doherty Amplifier. In particular, but not exclusively, the present disclosure relates to a four-way Doherty amplifier that is capable of amplifying a signal over a wide operating bandwidth.

BACKGROUND TO THE DISCLOSURE

Modulated radio-frequency (RF) signals are used in a wide variety of communications systems such as mobile phones, cellular base stations for mobile phones and satellite communications. In these applications, it is necessary to amplify the RF signal.

Conventional amplifiers have a generally linear relationship between input power and efficiency, and between input power and output power, during normal operation. As input power increases, efficiency and output power both increase. This means that high input power may be used to achieve high efficiency. Eventually, the amplifier is driven into saturation where the relationship between input power and output power is non-linear. In saturation, the output power does not increase as much.

It is undesired to operate an amplifier past saturation because driving an amplifier in the non-linear region also increases distortion of the signal. This means that when amplifying RF signals with high input power, conventional amplifiers cannot be used in the high-efficiency region, they have to be used in their linear region, where efficiency is much lower. To overcome this, Doherty topology amplifiers are used.

A Doherty amplifier has a main amplifier and a peak amplifier. The main amplifier is a class AB amplifier. The peak amplifier is a class C amplifier that begins to operate at higher input power levels when the main amplifier starts to saturate. With further increase of the input power, the peak amplifier modulates the load of the main amplifier in a way that maintains efficiency over a wide power dynamic range.

In use, an input signal is split and provided to the main amplifier and the peak amplifier. The outputs of the two amplifiers are combined to give an amplified output signal. At low input power, only the main amplifier is operational. At high input power, the peak amplifier is also operational. By using this arrangement, high efficiency can be provided.

RF signals in communications systems often have a high ratio of average power to peak power (sometimes 8 dB or higher). To ensure that the Doherty amplifier is operated in the linear region across the whole power range of the input, so that the amplifier is efficient and has reduced signal distortion, the Doherty amplifier is operated with the input power reduced from the maximum possible. This is known as operating the amplifier in back-off mode.

Doherty amplifiers with two peak amplifiers, also known as three-way Doherty amplifiers, have been used to improve the operating efficiency and power output in back-off mode. At low power, only the main amplifier is operational. At high power, both peak amplifiers are operational. At an intermediate power level, only one of the Doherty amplifiers is operational.

EP 2 403 135 to Alcatel Lucent proposes a four way Doherty power amplifier, which includes a main amplifier, and first, second and third peak amplifiers, the outputs of the amplifiers being coupled through an impedance network to an output node. The main amplifier is coupled to the output node through a first impedance inverting quarter wave transmission line. The first peak amplifier is coupled to the output node through second and third impedance inverting quarter wave transmission lines, in order to provide a resultant non-inverting impedance between the first peak amplifier and the output node, and the second peak amplifier is coupled to a node between the second and third transmission lines. The third peak amplifier is directly coupled to the output node. The output node is connected to an output load via an impedance transforming quarter wave transmission line.

In two, three, or four way Doherty amplifiers, the circuitry used to split the input signal and to combine the output signal such that the signals from the different amplifiers are phase and impedance matched causes a bottleneck that limits the frequencies over which the amplifier can be used. For example, in a cellular base station having allocated bands ranging from 0.7 GHz to 2.7 GHz, a Doherty amplifier may only have a relative bandwidth of the order of 5%, and thus each amplifier will only be able to operate over a single band. Therefore, to cover the whole bandwidth, a large number of different amplifiers have to be implemented which is costly in time and resources and inefficient in power consumption.

SUMMARY OF THE DISCLOSURE

According to a first aspect of the disclosure, there is provided a Doherty amplifier having a set of amplifiers comprising a main amplifier and at least one peak amplifier, each amplifier of the set of amplifiers having an input and an output, the at least one peak amplifier configured to become operational at a respective threshold power, the Doherty amplifier further comprising: a Doherty amplifier output node coupled to the outputs of the set of amplifiers through an impedance network, the impedance network comprising: impedance inverting elements configured to match the impedance of the outputs of the set of amplifiers at the Doherty amplifier output node; and a matching system coupled to the outputs of the set of amplifiers, the matching system configured to impedance match the modulated impedance output of the main amplifier to the impedance of the peak amplifiers.

The matching system may comprise: a primary matching element coupled to the output of a first of the set of amplifiers; and a secondary matching element to the output of a second of the set of amplifiers.

The primary matching element may comprise a single 180 degrees transmission line; and the secondary matching element may comprise a single 180 degrees transmission line.

The 180 degrees transmission lines may have characteristic impedances corresponding to the output impedance used to impedance match a predetermined load, when only the main amplifier is operational.

Alternatively, the primary matching element may comprise a first 90 degrees transmission line and a second 90 degrees transmission line connected in series; and the secondary matching element may comprise a third 90 degrees transmission line and a fourth 90 degrees transmission line connected in series.

The second and fourth 90 degrees transmission lines may have a characteristic impedance corresponding to the output impedance used from the transmission lines to, in use, impedance match a predetermined load, when only the main amplifier is operational; and the first and second 90 degrees transmission lines may be configured to apply an impedance transformation to the signals passing through them.

The Doherty amplifier may be a four-way Doherty amplifier, having a main amplifier and first, second, and third peak amplifiers.

The primary matching element may be coupled to the output of the third peak amplifier; the secondary matching element may be coupled to the output of the second peak amplifier; the output of the main amplifier may be combined with the output of the third peak amplifier to give a first combined signal at a first combination node provided between the output of the third peak amplifier and the primary matching element; and the output of the first peak amplifier may be combined with the output of the second peak amplifier to give a second combined signal at a second combination node, provided between the output of the second peak amplifier and the secondary matching element.

The main amplifier and third peak amplifier may be comprised in a first integrated Doherty amplifier; the first peak amplifier and the second peak amplifier may be comprised in a second integrated Doherty amplifier; and the first and second 90 degrees transmission lines may be provided between the output of the first integrated Doherty amplifier and the output node, and the third and fourth 90 degrees transmission lines may be provided between the output of the second integrated Doherty amplifier and the output node.

The first integrated Doherty amplifier may be provided on a first die and the second integrated Doherty amplifier may be provided on a second die, the first and second die provided in a first device package.

Each amplifier of the set of amplifiers may be provided on a separate die, wherein the first and second peak amplifiers may be provided in a first device package, and wherein the main and third peak amplifiers may be provided in a second device package.

The Doherty amplifier may comprise: a passive bandwidth modifier coupled to the Doherty amplifier output node, the passive bandwidth modifier configured to increase the operational bandwidth of an impedance inverter of the impedance network.

The passive bandwidth modifier may comprise an element selected from the group comprising: an open circuit 180 degrees transmission line coupled to the Doherty amplifier output node; and a short circuit 90 degrees transmission line coupled to the Doherty amplifier output node, and a circuit ground.

The Doherty amplifier may be arranged to operate over a range of 1.8 GHz to 2.2 GHz.

The Doherty amplifier may allow for impedance and phase matching of signals across a wider frequency range, which may increase the operational bandwidth of the Doherty amplifier. At least some of the above aspects of the disclosure provide a wideband Doherty amplifier that can be used in multiband RF communication systems.

According to a second aspect of the disclosure, there is provided a cellular base station comprising a Doherty amplifier according to the first aspect.

The present disclosure equally provides a Doherty amplifier, comprising a main amplifier and a first, second, and third peak amplifier, each amplifier having an input and an output. The amplifier further comprises a combining network configured for combining signals emerging at outputs of the main and peak amplifiers to be combined at a combining node. According to the disclosure, the combining network comprises a first impedance inverter arranged in between the output of the main amplifier and the output of the third peak amplifier, a second impedance inverter arranged in between the output of the first peak amplifier and the second peak amplifier, a first 180 degrees phase shifter arranged in between the output of the second peak amplifier and an intermediate node, a second 180 degrees phase shifter arranged in between the output of the third peak amplifier and the combining node, and a third impedance inverter arranged in between the combining node and the intermediate node.

The first, second, and third peak amplifier may be configured to become operational at a first, second, and third input power threshold, respectively, wherein the main amplifier is configured to become operational at a zeroth input power threshold, wherein the first input power threshold is larger than the zeroth input power threshold and smaller than the second and third input power threshold.

The third input power threshold may be larger than the second input power threshold.

The first and/or second 180 degrees phase shifter may comprise a series connection of a fourth and fifth impedance inverter, wherein the impedance transformation ratios of the fourth and fifth impedance inverter are different.

The Doherty amplifier may further comprise an impedance matching network connected in between the combining node and a load, the Doherty amplifier further comprising an open third 180 degrees phase shifter or a shorted sixth impedance inverter connected to the combining node.

The impedance matching network may comprise a seventh impedance inverter.

The first, second, and/or third 180 degrees phase shifter may comprise a 180 degrees transmission line. The first, second, and/or third 180 degrees transmission line may include a uniform characteristic impedance over its length.

Alternatively, the first, second, and/or third 180 degrees phase shifter may include a pi-network, wherein the pi-network includes a first capacitor to ground, a second capacitor to ground, and a first inductor arranged in between the first and second capacitors. Here, at least one of the first and second capacitors is at least partially formed by a parasitic capacitance of the main amplifier, the first peak amplifier, the second peak amplifier, or the third peak amplifier.

At least one of the first, second, third, fourth, fifth, sixth, and seventh impedance inverter may comprise a 90 degrees transmission line. Alternatively, at least one of the first, second, third, fourth, fifth, sixth, and seventh impedance inverter comprises a further pi-network, wherein the further pi-network comprises a third capacitor to ground, a fourth capacitor to ground, and a second inductor arranged in between the third and fourth capacitors. Here, at least one of the third and fourth capacitors is at least partially formed by a parasitic capacitance of the main amplifier, the first peak amplifier, the second peak amplifier or the third peak amplifier.

The main amplifier and the third peak amplifier may be comprised in a first integrated Doherty amplifier, and the first peak amplifier and the second peak amplifier may be comprised in a second integrated Doherty amplifier, wherein the first integrated Doherty amplifier may be provided on a first die and wherein the second integrated Doherty amplifier may be provided on a second die, wherein the first and second dies are provided in a first device package.

The Doherty amplifier may be arranged to operate over a range of 1.8 GHz to 2.2 GHz.

The disclosure further provides a cellular base station comprising a Doherty amplifier as described above.

These and other aspects of the disclosure will be apparent from, and elucidated with reference to, the embodiments described hereinafter.

BRIEF DESCRIPTION OF THE DRAWINGS

Embodiments will be described, by way of example only, with reference to the drawings.

FIG. 8B illustrates a pi-network, according to example embodiments.

Figure 1:
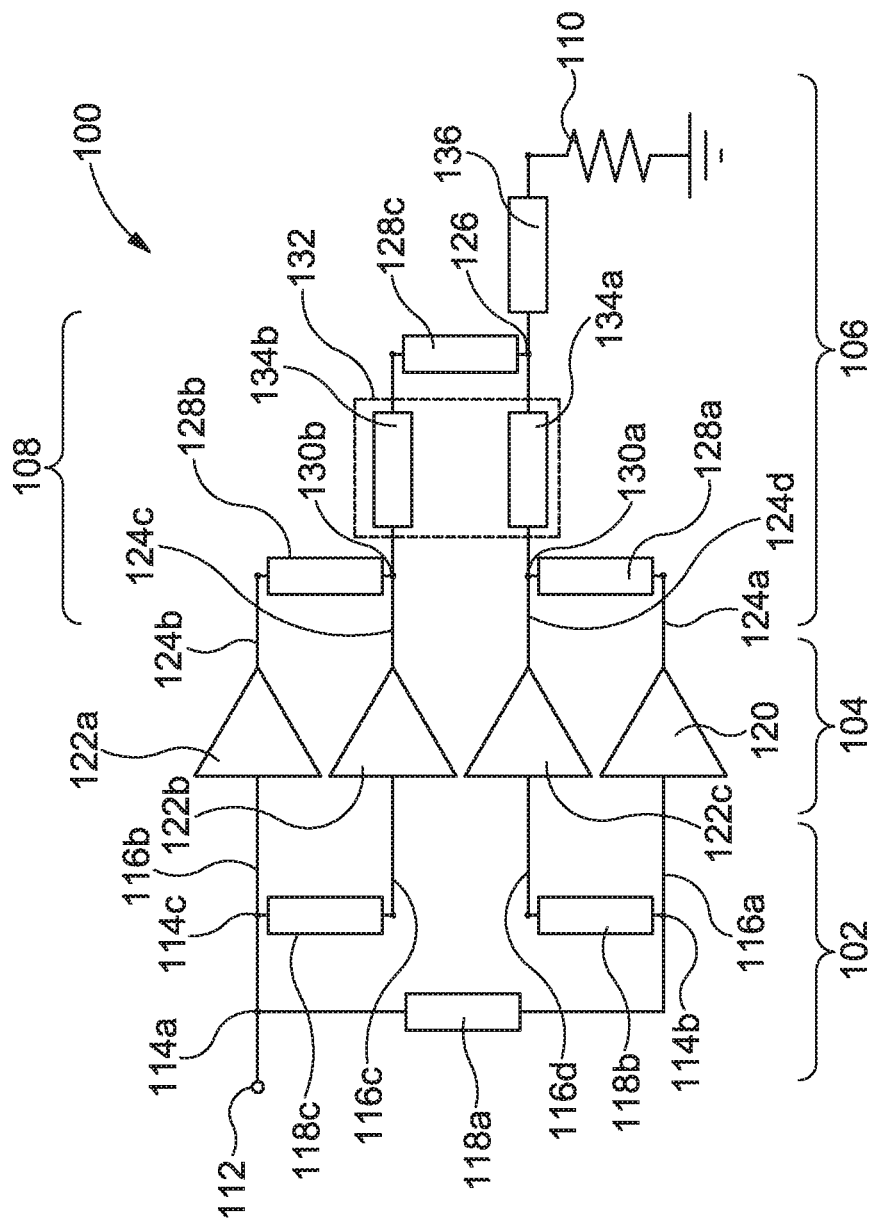
FIG. 1 illustrates a four-way Doherty amplifier having a matching system, according to example embodiments.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION

FIG. 1 shows an example of a four-way Doherty amplifier 100. The Doherty amplifier 100 includes an input stage 102, an amplifier stage 104, and an output stage 106.

The input stage 102 is configured to receive an RF input signal and to split the signal into separate parts, which are provided to the amplifier stage 104.

The amplifier stage 104 takes the separate signals and amplifies them to provide separate amplified signals.

The output stage 106 includes combination circuitry 108 that is configured to recombine the separate signals to provide an amplified RF output signal. The output signal is provided to a load 110. The combination circuitry 108 is configured to impedance match the separate amplified signals to the output load 110.

The impedance matching introduces phase shifts into the separate amplified signals. However, it is also desirable for the separate signals to be phase matched when then they are combined and so corresponding phase shifts are introduced in the input stage 102.

As a result, at the amplifier stage 104, the split signals have the same frequency as each other and the input signal, are out of phase from each other, and are reduced in power from the input signal. The combination circuitry 108 applies further frequency changes so that the split signals are impedance and phase matched.

In the embodiment shown in FIG. 1, the input stage 102 includes an input node 112 at which the input signal is received, and first, second, third, and fourth connection lines 116a-d at which the split signal is output.

After the input node 112, the input signal is split into first and second portions at a first splitting node 114a.

The first portion of the input signal is passed through a first input transmission line 118a. At a second splitting node 114b, the first portion of the signal is further split to form a first sub-portion of the input signal and a second sub-portion of the input signal.

The first sub-portion is provided at the first input line 116a. The second sub-portion of the input signal is passed through a second transmission line 118b, and provided on the fourth connection line 116d.

After the first splitting node 114a, the second portion of the input signal is again split, at a third splitting node 114c, to form third and fourth sub-portions of the input signal.

The third sub-portion of the input signal is provided on the second connection line 116b, and the fourth sub-portion of the input signal is provided on the third connection line 116c.

As discussed above, the sub-portions of the input signal have the same frequency and are out of phase from each other and reduced in power from the input signal. Each of the transmission lines 118 shifts the phase of the signal passing through it. The input transmission lines 118 are quarter wavelength transmission lines that introduce a quarter wavelength (90 degrees) phase shift in the signal passing through them.

The separate sub-portions of the input signal, provided on the connection lines 116, have the following phase shifts, relative to the input signal:

First connection line 116a (third sub portion): 90 degrees;
Second connection line 116b (fourth sub portion): 0;
Third connection line 116c (second sub portion): 90 degrees;
Fourth connection line 116d (first sub portion): 180 degrees.

The amplifier stage 104 includes a set of four amplifiers 120, 122a-c. The amplifier 120, 122a-c takes the sub-portions of the signal as an input, amplifying the sub-portions to provide amplified sub-portions. The amplified sub-portions are provided on first, second, third, and fourth output lines 124a-d.

The first connection line 116a of the input stage 102 provides the first sub-portion of the input signal as the input for the main amplifier 120 of the Doherty amplifier 100. The first sub-portion of the input signal is amplified and the first amplified sub-portion of the input signal is provided on the first output line 124*a*.

As discussed above, the main amplifier 120 is operated as a class AB amplifier, and is constructed and arranged to always be operational, when there is an input signal.

The second connection line 116*b* of the input stage 102 provides the third sub-portion of the input signal as the input for a first peak amplifier 122*a*. The third sub-portion of the input signal is amplified and the third amplified sub-portion of the input signal is provided on the second output line 124*b*.

The third connection line 116*c* of the input stage 102 provides the fourth sub-portion of the input signal as the input for a second peak amplifier 122*a*. The fourth sub-portion of the input signal is amplified and the fourth amplified sub-portion of the input signal is provided on the third output line 124*c*.

The fourth connection line 116*d* of the input stage 102 provides the second sub-portion of the input signal as the input for a third peak amplifier 122*c*. The second sub-portion of the input signal is amplified and the second amplified sub-portion of the input signal is provided on the fourth output line 124*b*.

As discussed above, the peak amplifiers 122 are operated as class C amplifiers, and are controlled to be operational once the input signal is above a certain threshold. In the current example, the thresholds are set so that, as the input power increases, the first peak amplifier 122*a* becomes operational first, the second peak amplifier 122*b* and the third peak amplifier 122*c* become operational next. The second 122*b* and third 122*c* peak amplifiers typically become operational at roughly the same threshold.

The combination circuitry 108 takes the signals from the output lines 124 and combines them to provide an output signal at the output node 126. In the below description, it will be assumed that the signal is such that all amplifiers 120, 122 are operational (also known as state 1 operation).

The first amplified sub-portion of the input signal, carried on first output line 124*a*, and the second amplified sub-portion of the input signal, carried on the fourth output line 124*d*, are combined at a first combination node 130*a*. This provides a first combined portion of the signal.

The first amplified sub-portion and the second amplified sub-portion are impedance matched at the first combination node 130*a* by passing the first amplified sub-portion through a first output transmission line 128*a*, before the first combination node 130*a*.

The first output transmission line 128*a* provides a phase difference 90 degrees to the first amplified sub-portion of the signal. This phase difference is offset by the second input transmission line 118*b*, and so the first amplified sub-portion of the input signal and the second amplified sub-portion of the input signal are also phase matched at the first combination node 130*a*.

Similarly, the third amplified sub-portion of the input signal, carried on second output line 124*b*, and the fourth amplified sub-portion of the input signal, carried on the third output line 124*c*, are combined at a second combination node 130*b*. This provides a second combined portion of the signal.

The third amplified sub-portion and the fourth amplified sub-portion are impedance matched at the second combination node 130*b* by passing the third amplified sub-portion through a second output transmission line 128*b*, before the second combination node 130*b*.

The second output transmission line 128*b* provides a phase difference of 90 degrees to the third amplified sub-portion of the signal. This phase difference is offset by the third input transmission line 118*c*, and so the third amplified sub-portion of the input signal and the fourth amplified sub-portion of the input signal are also phase matched at the second combination node 130*b*.

The first and second combined portions of the signal are combined into the output signal at the output node 126.

The first combined portion of the signal and the second combined portion of the signal are impedance matched at the output node 126 by passing the second combined portion of the signal through a third output transmission line 128*c*, before the second output node 126.

The third output transmission line 128*c* provides a phase difference of 90 degrees to the third amplified sub-portion of the signal. This phase difference is offset by the first input transmission line 118*a*, and so the first and second combined portions of the signal are also impedance matched at the second combination node 130*b*.

The output node 126 may be coupled to a load 110 with characteristic impedance. An output impedance converter 136 may be provided to impedance match the output node 126 to the load 110.

In one illustrative example, the load 110 may be a 50 ohm load, and the impedances at the output node 126 may be matched to 12.5 ohm. To achieve the correct impedance matching between the output node 126 and the load 110, the output impedance inverter 136 uses a characteristic impedance ($Z_0$) of 25 ohm.

The 50 ohm output load 110 is chosen as an illustrative example as this is a commonly used load for circuit design, and by using this load, the Doherty amplifier 100 will be compatible with circuit elements designed to the same load.

To achieve the impedance matching between the output lines 124, the first output transmission line 128*a* and the second output transmission line 128*b* have $Z_0$ of 50 ohm and the third output transmission line 128*c* has $Z_0$ of 25 ohm.

In the discussion above, state 1 operation has been assumed. The Doherty amplifier can also operate in state 2 and state 3. In state 2 operation, only the main amplifier 120 and the first peak amplifier 120*a* are operational. In state 3 operation, only the main amplifier 10 is operational.

In state 1 and state 2 operation, the amplifiers 120, 122 can be considered as equivalent to a first load with 25 ohm impedance at the first combination node 130*a* and a second load with 25 ohm impedance at the second combination node 130*b*. In state 3 operation, the amplifier stage 104 can be considered as equivalent to a load with 200 ohm impedance at the first combination node 130*a* and an open circuit at the second combination node 130*b*.

The combination circuitry 108 carries out impedance matching in all three states of operation. The impedance matching response of the combination circuitry 108 can be measured by the return. The return loss is the proportion of the signal that is reflected rather than transmitted further along the circuitry.

The return loss is dependent on the frequency of the input signal and hence the sub-portions of the signal. At a central operating frequency, the return loss will be a minimum. As the frequency deviates from this central operating frequency (higher or lower), the return loss increases. One way of defining the operating bandwidth of a Doherty amplifier is the frequency range over which the return loss is below a threshold. The relative operating bandwidth can be given by:

$$\frac{2(f_2 - f_1)}{(f_2 + f_1)} \times 100 \qquad (1)$$

where $f_2$ is the upper bound of the operating bandwidth and $f_1$ is the lower bound of the operating bandwidth.

Typically, combining circuitry 108 such as is described above has a relatively narrow operating bandwidth, around 10%, because as the frequency varies from the operating frequency, the return loss quickly increases.

To address this problem, a matching system 132 may be provided between the first combining node 130a, the second combining node 130b, and the output node 126.

In one example, the matching system 132 incorporates a primary matching element 134a provided between the first combination node 130a and the output node 126 and a secondary matching element 134b provided between the second combination node 130b and the output node 126. In this example, both matching elements 134 are formed from 180 degrees transmission lines.

The $Z_0$ for the primary matching element 134a is chosen to correspond to the impedance used at the output of the primary matching element 134a in state 3 operation. To impedance match the 50 ohm output, with output impedance inverter having $Z_0$=25 ohm, the first matching element has $Z_0$=12.5 ohm. $Z_0$ of the secondary matching element 134b is chosen to match the primary matching element 134a.

Since the transmission lines are 180 degrees transmission lines, the matching system may not affect the impedance matching of the system in any state of operation. Furthermore, since one of the elements is provided between the first combination node 130a and the output node 126 and the other is provided between the second combination node 130b and the output node 126, the matching system may not change the relative phases of the different signals, and the signals are still phase matched.

However, the effect of the matching system 132 may be to reduce the rate at which the return loss increases away from the central operating frequency, which in some cases may increase the relative bandwidth of the Doherty amplifier 100.

In state 1 and state 2 operation in some cases, the matching system 132 may result in a bandwidth of approximately 40%. In state 3 operation, the bandwidth may be for example approximately 16%.

The person skilled in the art will appreciate that a similar effect could be achieved with different arrangements of the combining circuitry 108. For example, the matching system may include separate matching elements on each of the output lines 124. Similarly, transmission lines are not necessarily used, and other components, such as equivalent C-L-C Pi networks, could be used instead.

Figure 2:
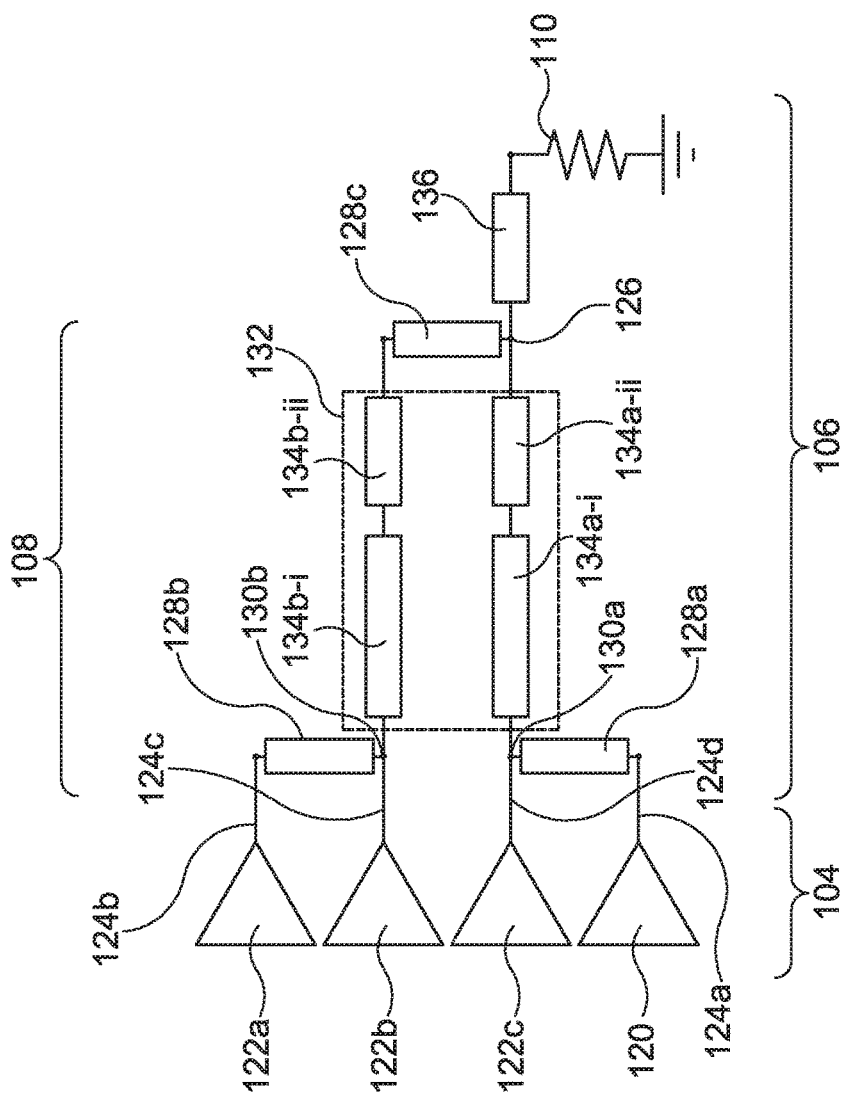
FIG. 2 illustrates an alternative example of a Doherty amplifier having a matching system, according to example embodiments.

FIG. 2 shows an alternative arrangement of the Doherty amplifier 100 of FIG. 1. For simplicity, FIG. 2 only shows the amplifier stage 104 and the output stage 106.

As in the Doherty amplifier 100 of FIG. 1, the combination circuitry 108 takes the signals from the output lines 124 and combines them to provide an output signal at the output node 126.

The arrangement of the combination nodes 130, and output transmission lines 128 is the same as in FIG. 1. As in the example described above, each of the output transmission lines 128 provides a 90 degrees phase shift to the signal passing through it.

In the example shown in FIG. 2, the primary matching element 134a is formed of a first primary matching sub-element 134a-i and a second primary matching sub-element 134a-ii and the secondary matching element 134b is formed of a first secondary matching sub-element 134b-i, and a second secondary matching sub-element 134b-ii. Each of the sub-elements 134 provides a 90 degrees phase shift, so the overall phase relationships compared to FIG. 1 are unchanged.

Because each of the matching sub-elements 134 now apply a 90 degrees phase shift, the sub-elements 134 act to alter the impedance of the signals passing through them, and so the $Z_0$ of the transmission lines and matching sub-elements 134 are adjusted so that the overall impedance at the output node 126 is the same as in FIG. 1.

Once again assuming a 50 ohm load 110 and an output impedance inverter 136 with $Z_0$=25 ohm:

First output transmission line 128a and second output transmission line 128b have $Z_0$=50 ohm;

Third output transmission line 128c has $Z_0$=25 ohm;

First primary matching sub-element 134a-i and first secondary matching sub-element 134b-I have $Z_0$=(2.5× 6.25)$^{1/2}$ ohm; and Second primary matching sub-element 134a-ii and second secondary matching sub-element 134b-ii have $Z_0$=12.5 ohm The output transmission lines 128 are the same as in FIG. 1, and the second primary matching sub-element 134a-ii and the second secondary matching sub-element 134b-ii are chosen to have the same impedance as the matching elements in FIG. 1. The first primary matching element 134a-i and first secondary matching sub-element 134b-i are selected to meet the matching conditions.

Figure 3:
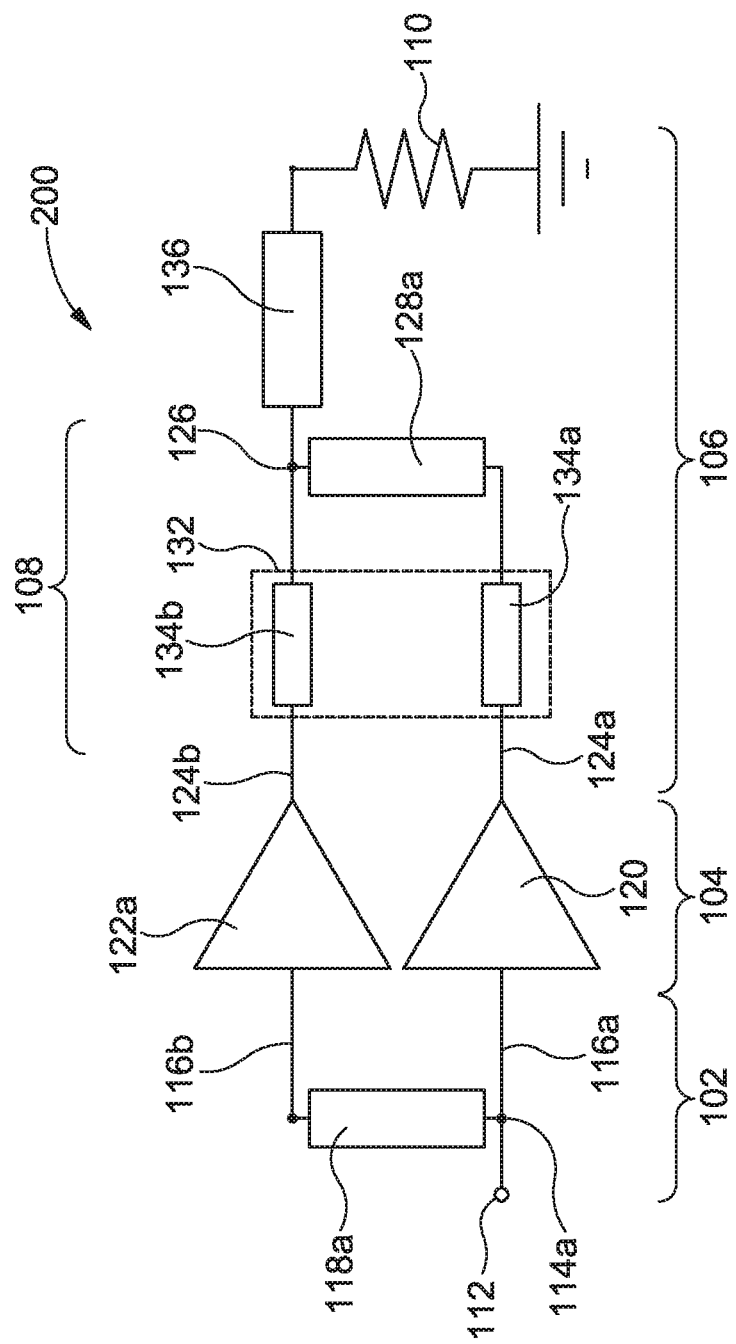
FIG. 3 illustrates a two-way Doherty amplifier having a matching system, according to example embodiments.

The matching system 132 can also be implemented in a two-way Doherty amplifier 200, as illustrated in FIG. 3. As in the previous example, the system is considered in the context of a 50 ohm output load 110.

A two-way Doherty amplifier 200 includes only the main amplifier 120 and the first peak amplifier 122a in the amplifier stage 104. In the example discussed below, the Doherty amplifier will be operated in a symmetric configuration, although asymmetric configurations may also be used.

In the input circuitry, the input signal is split into first and second portions at the first splitting node. The first portion is provided directly to the main amplifier 120 and the second portion is passed through the first input transmission line 118a, and then to the first peak amplifier 122a.

In the combination circuitry 108, the output of the main amplifier 120 is provided on the first output line 124a, and then coupled to the output node via the first output transmission line 128a. The output of the first peak amplifier 122a is provided on the second output line 124b, and is directly coupled to the output node 126.

In the two-way Doherty amplifier 200, the matching system is provided on the two output lines 124a, 124b. The primary matching element 134a is provided between the main amplifier 120 and the first output transmission line 128a. The secondary matching element 134b is provided between the first peak amplifier 122a and the output node 126.

The first output transmission line 128a introduces a 90 degrees phase shift in the signals that are combined at the output node 126. Accordingly, the first input transmission line 118a also introduces a 90 degrees phase shift in the signals.

Since the two-way Doherty amplifier 200 only includes two amplifiers 120, 122a, the impedances will have to be different on the outputs. To match to the 50 ohm output load, the first output transmission line 128a has a $Z_0$ of 50 ohm, and the output impedance inverter 136 has a $Z_0$ of 35.335 ohm. Accordingly, so that the $Z_0$ of the matching elements 134 matches the impedance used at the outputs of the matching elements 134, the $Z_0$ of the matching elements is 100 ohm.

FIG. 3 shows a two way Doherty amplifier 200 incorporating the matching system 132 of FIG. 1. Such a system has a relative operating bandwidth of 26%. It will be appreciated that the matching system 132 of FIG. 2 could also be employed in a two-way Doherty amplifier 200.

Figure 4A:
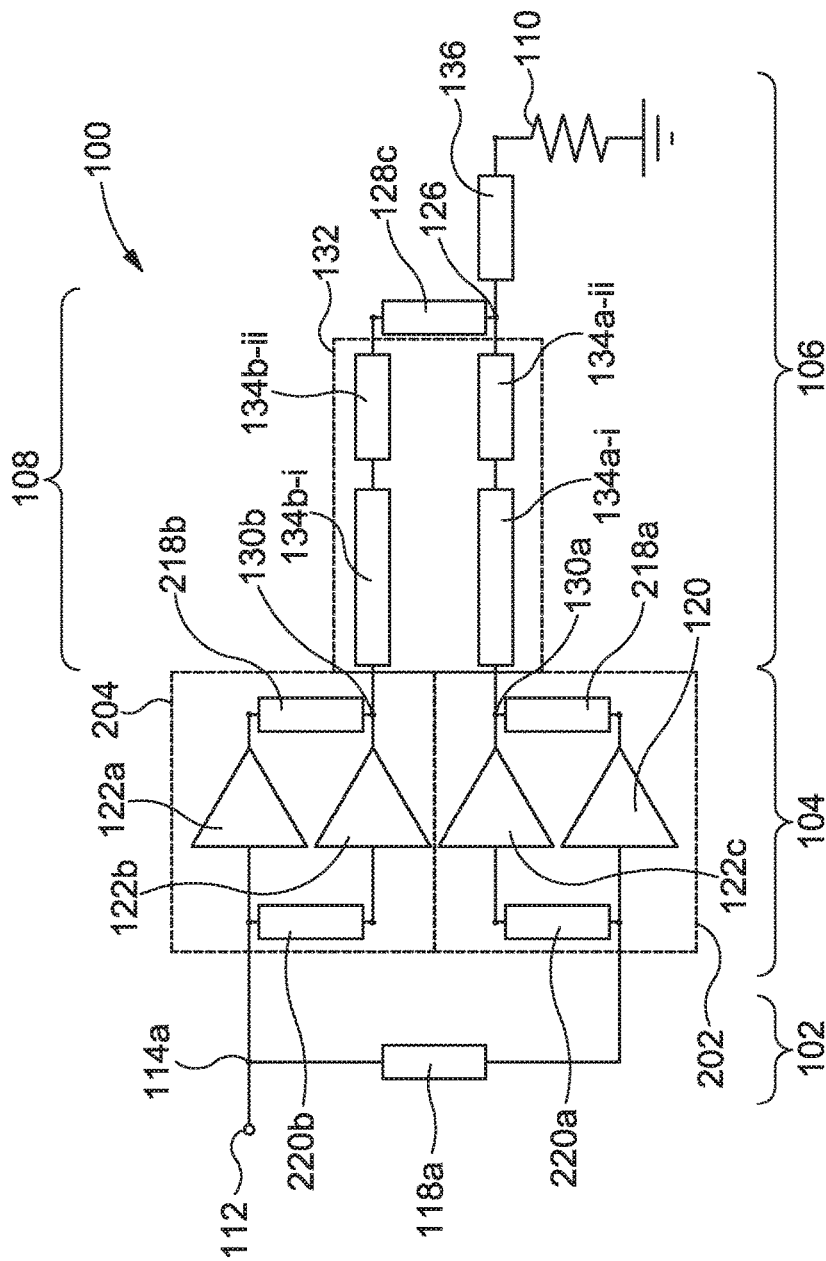
FIG. 4A illustrates an example of a four-way Doherty amplifier having a matching system, implemented with an integrated Doherty amplifier, according to example embodiments.
Figure 4B:
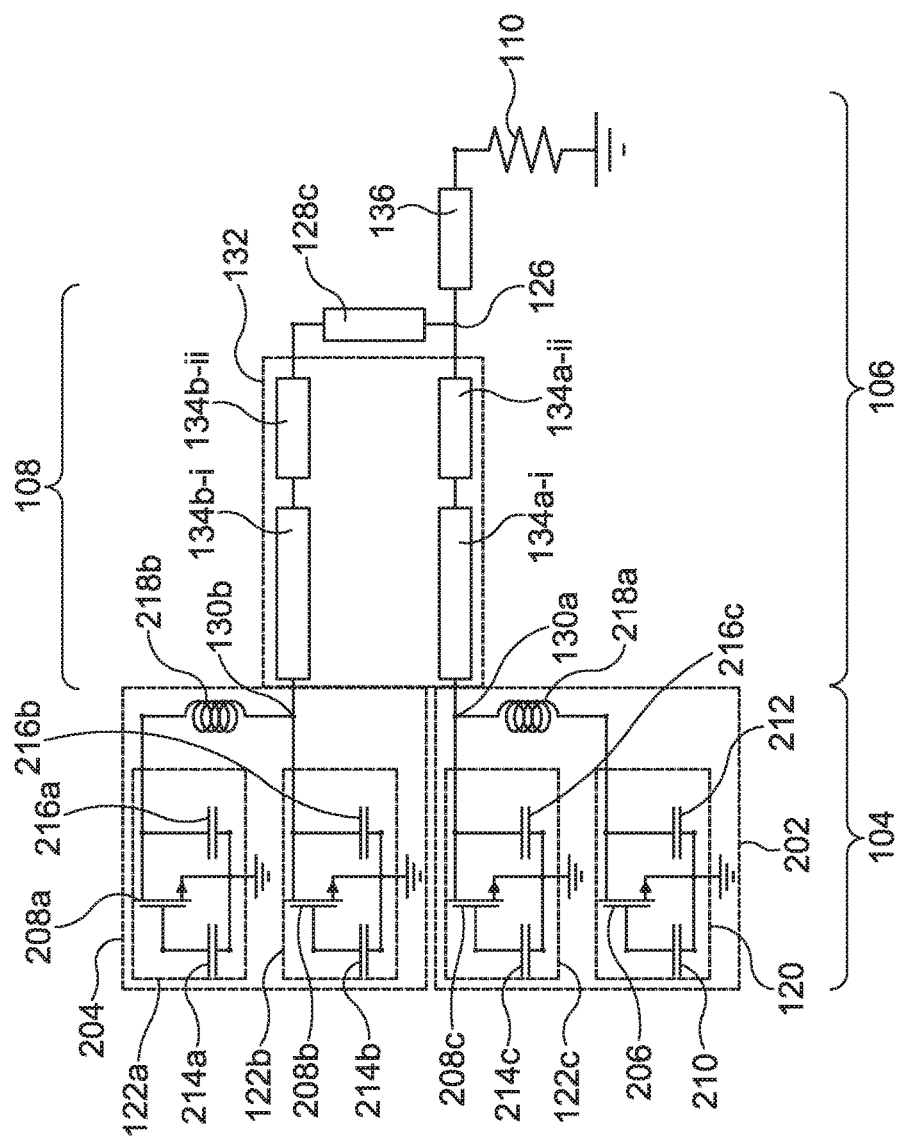
FIG. 4B illustrates an example of a four-way Doherty amplifier having a matching system, implemented with an integrated Doherty amplifier, according to example embodiments.

FIGS. 4A and 4B show a further alternative arrangement of a four-way Doherty amplifier 100. FIG. 4A illustrates the Doherty amplifier 100 in schematic form, and FIG. 4B illustrates the amplifier stage 104 and output stage 106 in more detail.

The amplifier stage 104 of the Doherty amplifier in FIGS. 3 and 4B includes a first integrated Doherty amplifier 202 and a second integrated Doherty amplifier 204.

An integrated Doherty amplifier 202, 204 is a Doherty amplifier where the signals between the pair of amplifiers is combined using a CLC pi-network formed by an inductor and the parasitic capacitances of the amplifiers. A similar CLC network is also formed on the input of the integrated Doherty amplifier 202, 204, to split the signal. The integrated Doherty amplifier allows for improved efficiency of amplifiers.

The input stage 102 of the Doherty amplifier 100 of FIG. 3 is equivalent to a 3 dB splitter. At the first splitting node 114a the signal is split into a first portion and a second portion. The first portion is further passed through the first input transmission line 118a, to the first integrated Doherty amplifier and the second portion is passed directly to the second integrated Doherty amplifier 204.

In some examples, impedance matching elements (not shown) may be provided on the inputs to both integrated Doherty amplifiers 202, 204. A first impedance matching element may be provided between the first input transmission line 118a and the first integrated Doherty amplifier 202, and a second impedance matching element may be provided between the first splitting node 114a and the second integrated Doherty amplifier 204.

In FIGS. 4A and 4B, the first integrated Doherty amplifier 202 is formed by the combination of the main amplifier 120 and the third peak amplifier 122c.

The main amplifier 120 is formed by a transistor 206. Parasitic capacitances are formed across the source and gate, and across the source and drain. These are shown in FIG. 4B as the main amplifier input capacitor 210 and main amplifier output capacitor 212 respectively.

The third peak amplifier 122c is also formed by a transistor 208c. As with the main amplifier 120, the parasitic capacitances are illustrated by the third peak amplifier input capacitor 214c and the third peak amplifier output capacitor 216c.

Within the first integrated Doherty amplifier 202, a first splitting inductor 220a (omitted in FIG. 4B) is coupled across the inputs of the main amplifier 120 and the third peak amplifier 122c and a first combining inductor 218a is connected across the outputs of the main amplifier 120 and the third peak amplifier 122c.

The first splitting inductor 220a is arranged so that the main amplifier 120 is coupled directly to the first input transmission line 118a, and the third peak amplifier 122c is coupled to the first input transmission line 118a through the first input inductor 220a. The output of the main amplifier 120 is coupled to the first combining node 130a, through the first combining inductor 218a and the output of the third peak amplifier 122c is directly coupled to the first combining node 130a.

The first combining inductor 218a couples to the main amplifier output parasitic capacitance 212 and the third peak amplifier output parasitic capacitance 216c to form a CLC pi-network. The CLC pi-network causes the outputs of the main amplifier 120 and the third peak amplifier 122c to be phase and impedance matched at the first combination node 130a.

The second integrated Doherty amplifier 204 is formed by the combination of the first peak amplifier 122a and the second peak amplifier 122b.

The first peak amplifier 122a is formed by a transistor 208a. Parasitic capacitances are formed across the source and gate, and across the source and drain. These are shown in FIG. 4B as the first peak amplifier input capacitor 214a and first peak amplifier output capacitor 216a respectively.

The second peak amplifier 122b is also formed by a transistor 208b. As with the first peak amplifier 120, the parasitic capacitances are illustrated by the second peak amplifier input capacitor 214b and the second peak amplifier output capacitor 216b.

Within the second integrated Doherty amplifier 204, a second splitting inductor 220b (omitted in FIG. 4B) is coupled across the inputs of the first peak amplifier 122a and the second peak amplifier 122b and a second combining inductor 218b is connected across the outputs of the first peak amplifier 122a and the second peak amplifier 122b.

The second splitting inductor 220b is arranged so that the first peak amplifier 122a is coupled directly to the first splitting node 114a, and the second peak amplifier 122b is coupled to the first splitting node 114a through the second input inductor 220b. The output of the first peak amplifier 122a is coupled to the second combining node 130b, through the second combining inductor 218b and the output of the second peak amplifier 122b is directly coupled to the second combining node 130b.

The second combining inductor 218b couples to the first peak amplifier output parasitic capacitance 216a and the second peak amplifier output parasitic capacitance 216b to form a CLC pi-network. The CLC pi-network causes the outputs of the first peak amplifier 122a and the second peak amplifier 122b to be phase and impedance matched at the second combination node 130b.

After the first and second combination nodes 130, the structure of the combination circuitry 108 and output stage is as described in relation to FIG. 2. As in the previous examples, the third output transmission line introduces a 90 degrees phase shift and has $Z_0$=25 ohm. To account for this phase shift, the first input transmission line 118a also introduces a 90 degrees phase shift.

Unlike the example in FIG. 2, the phase shifts introduced by each of the matching elements 134 is not 90 degrees. In the current example, the first primary matching element 134a-i and first secondary matching element 134b-i both introduce a 74 degrees phase shift and the second primary matching element 134a-ii and the second secondary matching element 134b-ii both introduce a 65 degrees phase shift. These values are by way of example only, and any suitable values may be used to achieve phase and impedance matching.

Furthermore, the output impedance of the integrated Doherty amplifiers may be different, and so the $Z_0$ of the matching elements must be adjusted. As with the previous examples, the second primary matching element 134a-ii and the second secondary matching element 134b-ii have $Z_0$ of 12.5 ohm, which corresponds to the impedance used at the output of the elements to match to the 50 ohm load. The first primary matching element 134a-i and the first secondary matching element 134b-i have $Z_O$=7.5 ohm.

Figure 5:
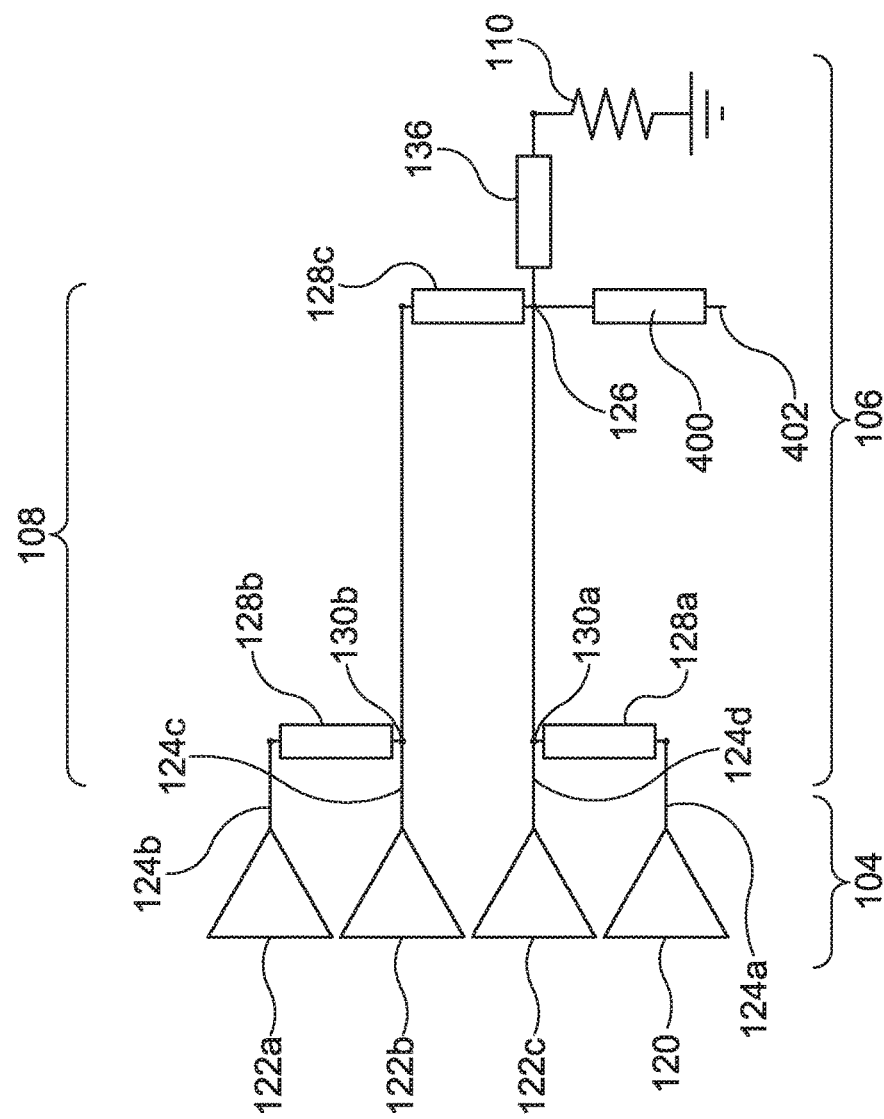
FIG. 5 illustrates an example of a Doherty amplifier having a bandwidth modifier, according to example embodiments.

FIG. 5 shows yet another Doherty amplifier 100, which has an increased operating bandwidth. Once again, only the amplifier stage 104 and the output stage 106 are shown for clarity. The input stage 102 is as described with reference to FIG. 1.

As in the Doherty amplifier 100 of FIG. 1, the combination circuitry 108 takes the signals from the output lines 124 and combines them to provide an output signal at the output node 126.

The arrangement of the combination nodes 130, and output transmission lines 128 is the same as in FIG. 1. As in the example described above, each of the output transmission lines 128 provides a 90 degrees phase shift to the signal passing through it.

The Doherty amplifier 100 of FIG. 5 includes a bandwidth modifier 400. In FIG. 5, the bandwidth modifier 400 is a transmission line. A first end of the bandwidth modifier 400 is coupled to the output node 126.

In a first example of the bandwidth modifier 400, the transmission line is a 180 degrees transmission line, and the second end 402 of the transmission line is left open circuit. In a second example of the bandwidth modifier 400, the transmission line is a 90 degrees transmission line, and the second end 402 of the transmission line is coupled to a circuit ground, forming a short circuit. In both examples, the transmission line has $Z_O$=25 ohm. This is chosen to be the same as the third output transmission line 128c.

The bandwidth modifier 400 may increase the bandwidth of the third output transmission line 128c by reducing the return losses at frequencies away from the central operating frequency.

In state 1 and state 2 operation in some cases, the bandwidth modifier 400 may result in a bandwidth of approximately 35%. In state 3 operation, the bandwidth may be approximately 20%.

The person skilled in the art will appreciate that an equivalent C-L-C Pi-network may be used as the bandwidth modifier 400, instead of a transmission line in other examples.

FIG. 5 illustrates the use of a bandwidth modifier 400 without the use of a matching system 132. It will be appreciated that the bandwidth modifier 400 and the matching system 132 may be used independently. However, the matching element may also be used in the Doherty amplifiers 100 of FIG. 1, 2 or 3.

Figure 6A:
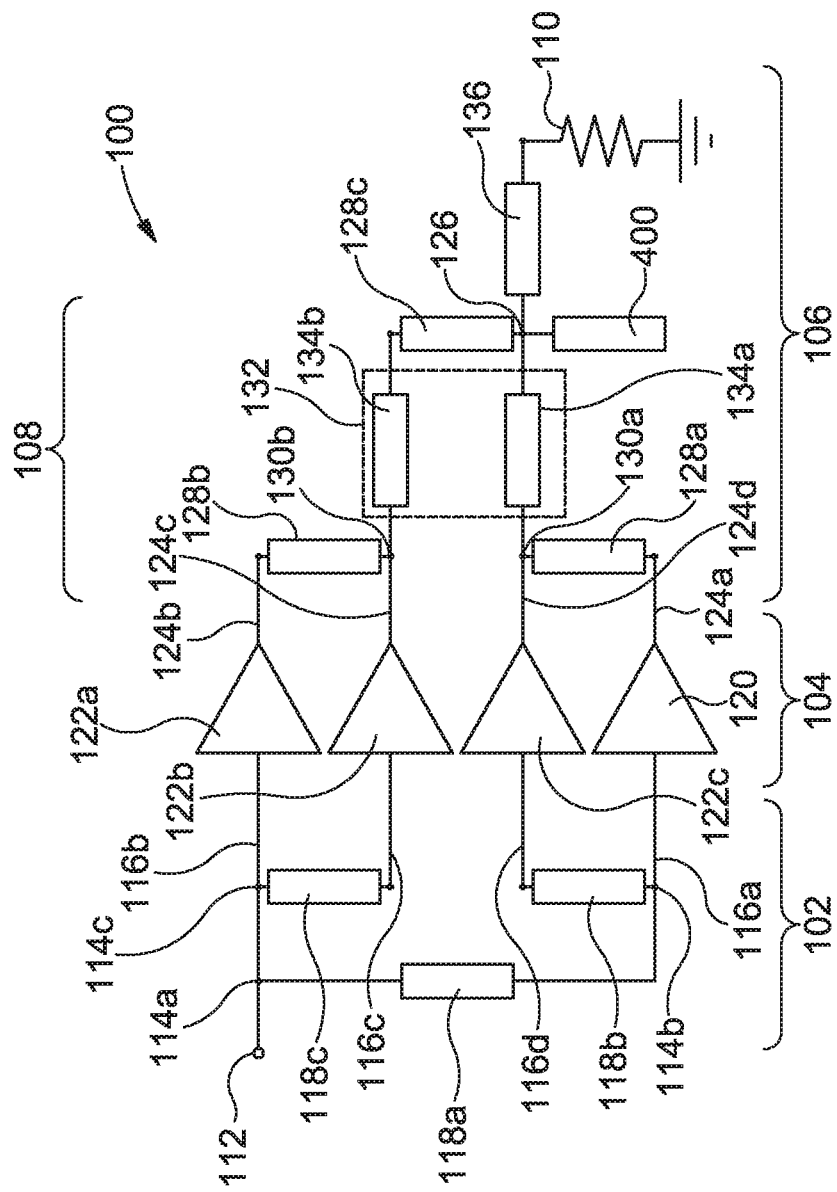
FIG. 6A illustrates the Doherty amplifier of FIG. 1, incorporating a bandwidth modifier, according to example embodiments.
Figure 6B:
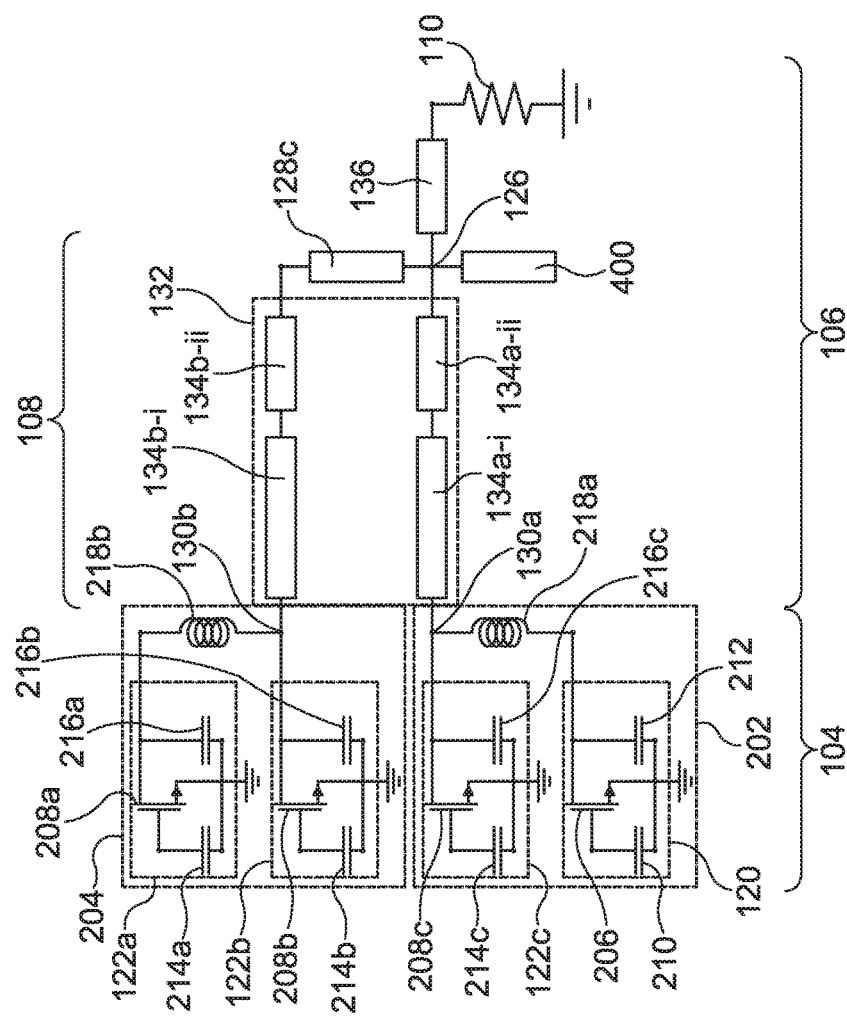
FIG. 6B illustrates the Doherty amplifier of FIGS. 4A and 4B, incorporating a bandwidth modifier, according to example embodiments.

For example, FIG. 6A shows the Doherty amplifier of FIG. 1, with a 180 degrees open circuit bandwidth modifier 400, and FIG. 6B shows the Doherty amplifier of FIG. 3, with a 180 degrees open circuit bandwidth modifier 400.

The modifier 400 can also be added to the two-way Doherty amplifier 200 of FIG. 3. In this case, the modifier 400 has the shame phase shift depending on if it is open circuit or short circuit, and has $Z_O$=50 ohm, which is equivalent to the first output transmission line 128a.

Figure 7A:
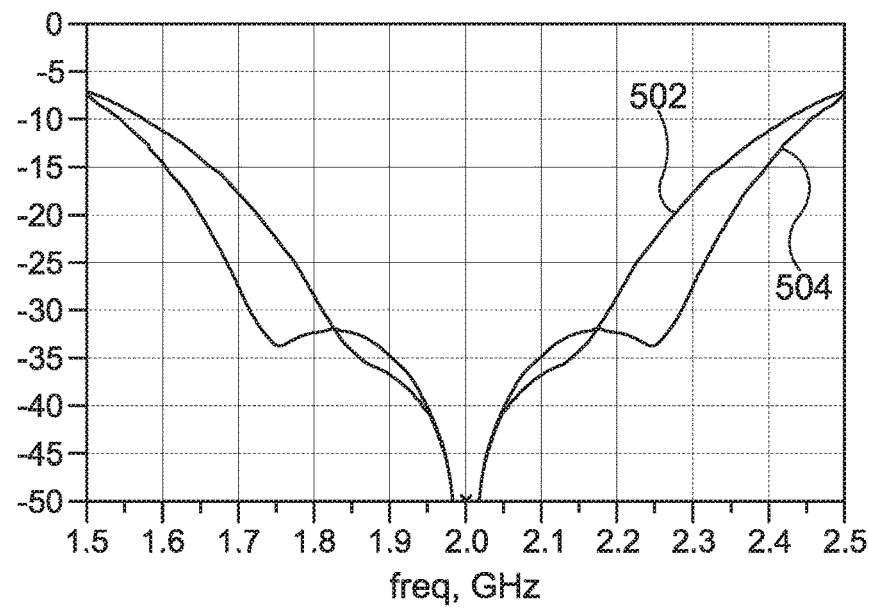
FIG. 7A illustrates the simulated bandwidth response of the Doherty amplifier of FIG. 6A, according to example embodiments.

FIG. 7A shows the simulated bandwidth response of the Doherty amplifier 100 of FIG. 6A. The bandwidth response is shown for full power operation 502, and for operation at 6 dB back-off 504. For use in a cellular base station, the bandwidth is defined as the frequency range over which the optimized 502 and back off 504 response is less than −25 dB. Accordingly, the bandwidth is greater than 1.8 GHz to 2.2 GHz (20%). The choice of threshold is by example only, and any threshold may be used.

Figure 7B:
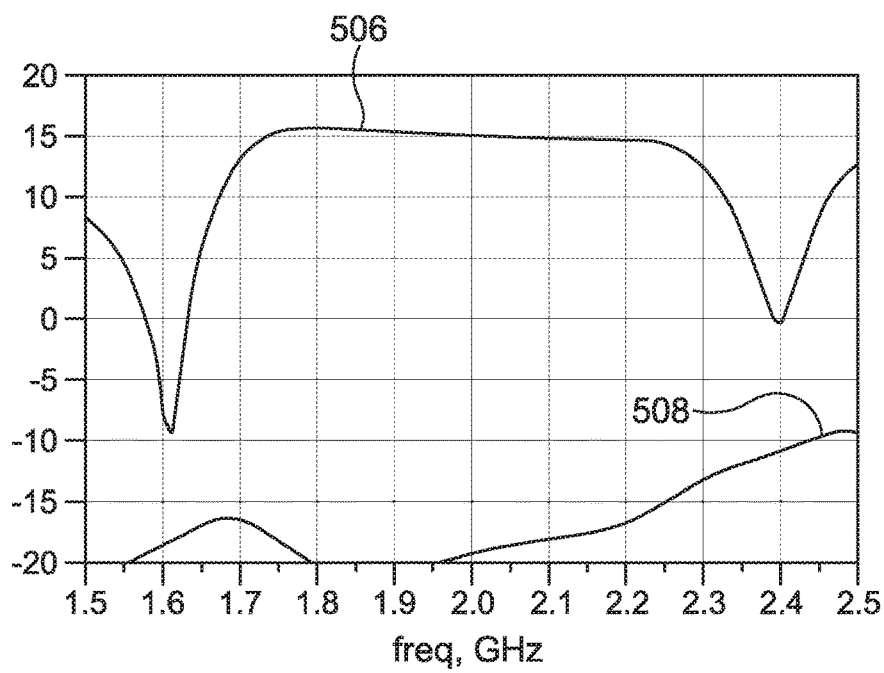
FIG. 7B illustrates the simulated gain and return loss of the Doherty amplifier of FIG. 6B, according to example embodiments.

FIG. 7B shows the simulated gain 506 and input return loss 508 in dB of the Doherty amplifier 100 of FIG. 6B, in state 3 operation. For use in a cellular base station, the bandwidth is defined as the frequency range over which the return loss is below −15 dB and the gain is approximately 15 dB. As can be seen from FIG. 7A, the operating bandwidth is approximately 1.8 GHz to 2.2 GHz (20%). The choice of threshold is by example only, and any threshold may be used.

Figure 7C:
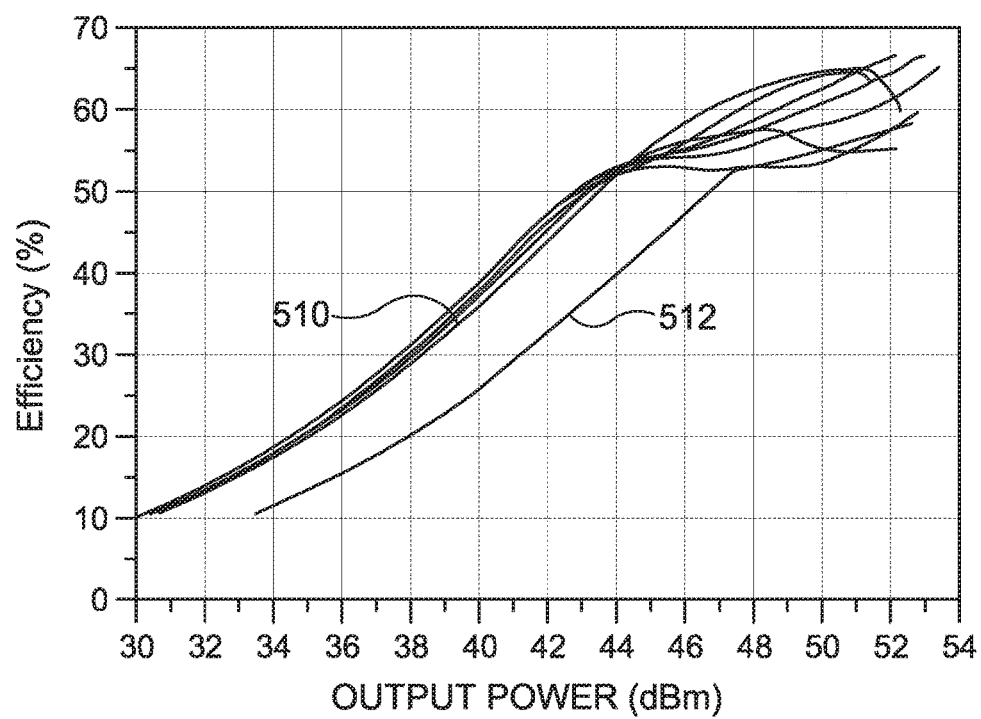
FIG. 7C illustrates the simulated efficiency of the Doherty amplifier of FIG. 6B, according to example embodiments.

FIG. 7C shows the simulated efficiency as a function of the output power of the Doherty amplifier 100 of FIG. 6B. The higher group of curves 510 shows the efficiency at different frequencies between 1.8 GHz and 2.2 GHz. The lower curve shows the efficiency for two separate integrated Doherty amplifiers (symmetric, with the same gate configuration and operated in the balanced configuration) for comparison.

The maximum power is ~52 dBm. At 8 dB back-off (44 dBm), the efficiency is improved from 40% to 52%. At 16 dB back-off (36 dBm), the efficiency has improved from 15% to 23%.

Figure 8A:
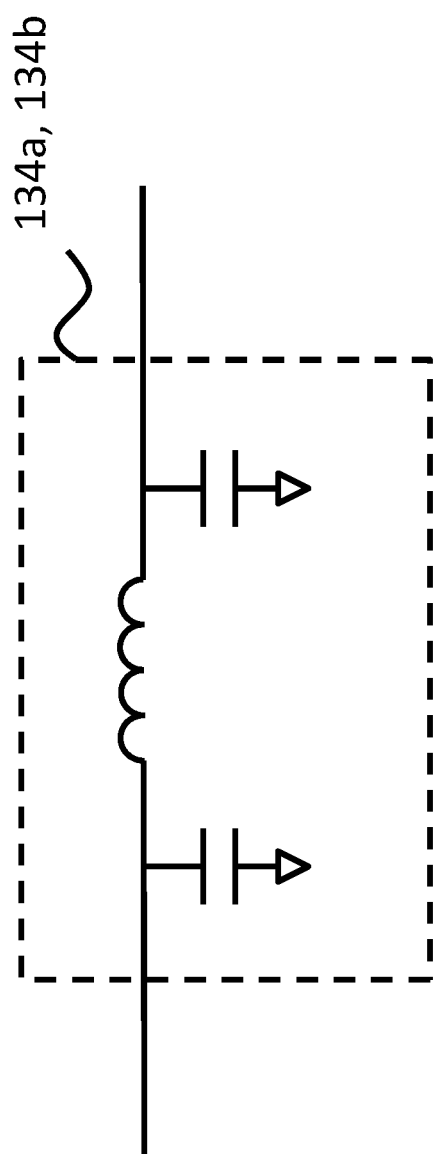
FIG. 8A illustrates a pi-network, according to example embodiments.

FIG. 8A illustrates a pi-network, according to example embodiments. The pi-network may be included in the primary matching element 134a or the secondary matching element 134b, in various embodiments. The pi-network may include a first capacitor to ground, a second capacitor to ground, and a first inductor arranged between the first capacitor and the second capacitor, as illustrated.

FIG. 8B illustrates a pi-network, according to example embodiments. The pi-network may be included in the first output transmission line 128a, the second output transmission line 128b, or the third output transmission line 128c, in various embodiments. Further, in some embodiments, an output impedance inverter of the Doherty amplifier may include the pi-network illustrated. The pi-network may include a first capacitor to ground, a second capacitor to ground, and a first inductor arranged between the first capacitor and the second capacitor, as illustrated.

The different stages of the Doherty amplifier 102, 104, 106 may be provided separately, such that the amplifier stage 104 may be provided in a first package, the input stage 102 may be provided separately, in a second package or on printed circuit board, and the combination circuitry 108 (and possibly the remainder of the output stage 106) may be provided separately, in a third package or on printed circuit board. However it will be appreciated that other package arrangements may be implemented.

In Doherty amplifiers that do not use the integrated Doherty amplifier architecture, each amplifier 120, 122 may be provided on a separate semiconductor die. The main amplifier 120 and third peak amplifier 122c may then be provided in a first device package, having four RF leads (two in, two out), and the first peak amplifier 122a and the second peak amplifier 122b may be provided in a second device package having four RF leads. The device packages, input stage 102 and combination circuitry 108 may then be provided on printed circuit board. The output impedance converter 136 and load may or may not be provided on the circuit board.

Where the integrated Doherty amplifier architecture is used, the main amplifier 120 and third peak amplifier 122c may then be provided on a first die, and the first peak amplifier 122a and the second peak amplifier 122b may be provided in a second die. The first and second die may be provided in a single device package having four RF leads. The device package, input stage 102 and combination circuitry 108 may then be provided on printed circuit board.

The output impedance converter 136 and load may or may not be provided on the circuit board.

In the above description, it has been assumed that all three peak amplifiers 122 are operational. It will be appreciated that where some or all of the peak amplifiers 122 are not operational, the combination circuitry still functions to phase and impedance match the amplified sub-portion(s) of the input signal at the output node 126. To this end, offset lines may be included on the output lines 124, as will be understood by the person skilled in the art.

It will be appreciated by the person skilled in the art that the input stage 102 discussed above and shown in the figures is by example only. Any suitable circuitry that takes an RF signal as an input and provides split signals having the same frequency and corresponding phase shifts to compensate for the phase shifts introduced in the combination circuitry 108, could be used.

It will be also appreciated by the person skilled in the art that the combination circuitry 108 discussed above and shown in the figures is also by example only. Any suitable circuitry that combines the separate signals and applies corresponding impedance matching could be used.

In the above description and associated figures, it has been assumed that the amplifiers 120, 122 are Field Effect Transistors (FETs) having a gate, source and drain, with the gate voltage being used to control the threshold power at which the amplifier turns on. However, it will be appreciated that any suitable transistor or amplifier may be used.

It will further be appreciated that where transmission lines have been referred to in terms of 90 degrees or 180 degrees phase shift, this phase shift is representative of the ideal phase shift at the central operating frequency of the Doherty amplifier 100. As the operating frequency varies away from the central operating frequency, the phase shift of the transmission line will also vary. For example, a 90 degrees transmission line may cause a 90 degrees phase shift at 2 GHz operation, an 80 degrees phase shift at 1.8 GHz and a 100 degrees phase shift at 2.2 GHz.

From reading the present disclosure, other variations and modifications will be apparent to the skilled person. Such variations and modifications may involve equivalent and other features of Doherty Amplifiers, and which may be used instead of, or in addition to, features already described herein.

Although the appended claims are directed to particular combinations of features, it should be understood that the scope of the disclosure also includes any novel feature or any novel combination of features disclosed herein either explicitly or implicitly or any generalization thereof, whether or not it relates to the same embodiment as presently claimed in any claim and whether or not it mitigates any or all of the same technical problems as does the present embodiment.

Features which are described in the context of separate embodiments may also be provided in combination in a single embodiment. Conversely, various features which are, for brevity, described in the context of a single embodiment, may also be provided separately or in any suitable subcombination. The Applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

The invention claimed is:

1. A Doherty amplifier, comprising:
   a main amplifier and a first peak amplifier, a second peak amplifier, and a third peak amplifier, each amplifier having an input and an output;
   a combining network configured for combining signals emerging at outputs of the main amplifier, the first peak amplifier, the second peak amplifier, and the third peak amplifier, wherein the signals are combined at a combining node, and wherein the combining network comprises:
      a first impedance inverter arranged in between the output of the main amplifier and the output of the third peak amplifier to combine the output of the main amplifier with the output of the third peak amplifier at the output of the third peak amplifier;
      a second impedance inverter arranged in between the output of the first peak amplifier and the output of the second peak amplifier to combine the output of the first peak amplifier with the output of the second peak amplifier at the output of the second peak amplifier;
      a first 180 degrees phase shifter arranged in between the output of the second peak amplifier and an intermediate node;
      a second 180 degrees phase shifter arranged in between the output of the third peak amplifier and the combining node; and
      a third impedance inverter arranged in between the combining node and the intermediate node.

2. The Doherty amplifier according to claim 1,
   wherein the first peak amplifier, the second peak amplifier, and the third peak amplifier are configured to become operational at a first input power threshold, a second input power threshold, and a third input power threshold, respectively,
   wherein the main amplifier is configured to become operational at a zeroth input power threshold, and
   wherein the first input power threshold is larger than the zeroth input power threshold and smaller than the second input power threshold and the third input power threshold.

3. The Doherty amplifier according to claim 2, wherein the third input power threshold is larger than the second input power threshold.

4. The Doherty amplifier according to claim 1,
   wherein at least one of the first 180 degrees phase shifter and the second 180 degrees phase shifter comprises a series connection of a respective fourth impedance inverter and a respective fifth impedance inverter,
   wherein impedance transformation ratios of the respective fourth impedance inverter and the respective fifth impedance inverter are different.

5. The Doherty amplifier according to claim 4, further comprising:
   an impedance matching network connected in between the combining node and a load; and
   an open third 180 degrees phase shifter or a shorted sixth impedance inverter connected to the combining node.

6. The Doherty amplifier according to claim 5, wherein the impedance matching network comprises a seventh impedance inverter.

7. The Doherty amplifier according to claim 1, wherein at least one of the first 180 degrees phase shifter and the second 180 degrees phase shifter comprises a 180 degrees transmission line.

8. The Doherty amplifier according to claim 7, wherein the 180 degrees transmission line comprises a uniform characteristic impedance over its length.

9. The Doherty amplifier according to claim 6,
wherein at least one of the first 180 degrees phase shifter and the second 180 degrees phase shifter comprises a pi-network
that comprises:
a first capacitor to ground;
a second capacitor to ground; and
a first inductor arranged in between the first capacitor and the second capacitor.

10. The Doherty amplifier according to claim 9, wherein at least one of the first capacitor and the second capacitor is at least partially formed by a parasitic capacitance of the main amplifier, the first peak amplifier, the second peak amplifier, or the third peak amplifier.

11. The Doherty amplifier according to claim 1, wherein at least one of the first impedance inverter, the second impedance inverter, and the third impedance inverter comprises a 90 degrees transmission line.

12. The Doherty amplifier according to claim 1,
wherein at least one of the first impedance inverter, the second impedance inverter, and the third impedance inverter comprises a pi-network that
comprises:
a third capacitor to ground;
a fourth capacitor to ground; and
a second inductor arranged in between the third capacitor and the fourth capacitor.

13. The Doherty amplifier according to claim 12, wherein at least one of the third capacitor and the fourth capacitor is at least partially formed by a parasitic capacitance of the main amplifier, the first peak amplifier, the second peak amplifier, or the third peak amplifier.

14. The Doherty amplifier according to claim 1,
wherein the main amplifier and the third peak amplifier are part of a first integrated Doherty amplifier,
wherein the first peak amplifier and the second peak amplifier are part of a second integrated Doherty amplifier,
wherein the first integrated Doherty amplifier is provided on a first die,
wherein the second integrated Doherty amplifier is provided on a second die, and
wherein the first and second dies are provided in a first device package.

15. The Doherty amplifier according to claim 1, arranged to operate over a range of 1.8 GHz to 2.2 GHz.

16. A cellular base station comprising a Doherty amplifier, wherein the Doherty amplifier comprises:
a main amplifier and a first peak amplifier, a second peak amplifier, and a third peak amplifier, each amplifier having an input and an output;
a combining network configured for combining signals emerging at outputs of the main amplifier, the first peak amplifier, the second peak amplifier, and the third peak amplifier, wherein the signals are combined at a combining node, and wherein the combining network comprises:
a first impedance inverter arranged in between the output of the main amplifier and the output of the third peak amplifier to combine the output of the main amplifier with the output of the third peak amplifier at the output of the third peak amplifier;
a second impedance inverter arranged in between the output of the first peak amplifier and the output of the second peak amplifier to combine the output of the first peak amplifier with the output of the second peak amplifier at the output of the second peak amplifier;
a first 180 degrees phase shifter arranged in between the output of the second peak amplifier and an intermediate node;
a second 180 degrees phase shifter arranged in between the output of the third peak amplifier and the combining node; and
a third impedance inverter arranged in between the combining node and the intermediate node.

17. The Doherty amplifier according to claim 1, further comprising:
a Doherty amplifier output node coupled to the output of the main amplifier and the output of at least one of the first peak amplifier, the second peak amplifier, and the third peak amplifier through an impedance network, wherein the impedance network comprises:
impedance inverting elements configured to match impedances of the outputs of the main amplifier and the at least one of the first peak amplifier, the second peak amplifier, and the third peak amplifier at the Doherty amplifier output node; and
a matching system coupled to the outputs of the main amplifier and the at least one of the first peak amplifier, the second peak amplifier, and the third peak amplifier, wherein the matching system is configured to impedance match a modulated impedance output of the main amplifier to an impedance of the at least one of the first peak amplifier, the second peak amplifier, and the third peak amplifier; and
a passive bandwidth modifier coupled to the Doherty amplifier output node, wherein the passive bandwidth modifier is configured to increase an operational bandwidth of an impedance inverter of the impedance network.

18. The Doherty amplifier according to claim 17, wherein the passive bandwidth modifier comprises an element selected from the group consisting of:
an open circuit 180 degrees transmission line coupled to the Doherty amplifier output node; and
a short circuit 90 degrees transmission line coupled to the Doherty amplifier output node and a circuit ground.

* * * * *